(12) United States Patent
Orr

(10) Patent No.: US 7,113,575 B2
(45) Date of Patent: Sep. 26, 2006

(54) ADSL FILTER

(75) Inventor: Bruce Francis Orr, Balgowlah (AU)

(73) Assignee: Alcatel, Paris (FR)

( * ) Notice: Subject to any disclaimer, the term of this patent is extended or adjusted under 35 U.S.C. 154(b) by 102 days.

(21) Appl. No.: 10/912,160

(22) Filed: Aug. 6, 2004

(65) Prior Publication Data

US 2005/0007214 A1    Jan. 13, 2005

Related U.S. Application Data

(62) Division of application No. 10/110,412, filed as application No. PCT/AU00/00995 on Aug. 24, 2000, now Pat. No. 6,952,128.

(30) Foreign Application Priority Data

Oct. 14, 1999 (AU) .................................. 199954014

(51) Int. Cl.
*H04M 11/00* (2006.01)

(52) U.S. Cl. .............................. 379/93.05; 379/399.01; 379/93.01

(58) Field of Classification Search ............ 379/93.01, 379/93.05, 399.01
See application file for complete search history.

(56) References Cited

U.S. PATENT DOCUMENTS

| 5,349,242 A | 9/1994 | Tanaka et al. |
| 5,608,237 A | 3/1997 | Aizawa et al. |
| 6,078,794 A | 6/2000 | Peckham |
| 6,144,735 A * | 11/2000 | Bella ..................... 379/399.01 |

FOREIGN PATENT DOCUMENTS

| AU | 36813/99 | 1/2000 |
| EP | 0 967 736 A1 | 12/1999 |
| WO | WO 99/40686 | 8/1999 |
| WO | WO 00/28660 | 5/2000 |

* cited by examiner

*Primary Examiner*—Jefferey F. Harold
(74) *Attorney, Agent, or Firm*—Sughrue Mion, PLLC

(57) ABSTRACT

An ADSL/POTS filter arrangement includes a filter and a switchable return loss correction circuit coupled to one side of the filter. The switchable return loss correction circuit includes a resistor and an inductor connected in parallel, a polarity insensitive solid state switch, and a capacitor connected in series between the switch and the parallel-connected resistor and inductor. The switchable return loss correction circuit is switched on by the polarity insensitive solid state switch which is controlled by a line sensor depending on whether the POTS telephone is on or off-hook.

7 Claims, 4 Drawing Sheets

ADSL FILTER

This is a divisional of application Ser. No. 10/110,412 filed Jul. 12, 2002, now U.S. Pat. No. 6,952,128, which is a 371 of PCT/AU0000995 filed Aug. 24, 2000, the disclosures of which are incorporated herein by reference.

TECHNICAL FIELD

This invention relates to a filter circuit, and will be described with reference to an ADSL/POTS filter.

BACKGROUND ART

ADSL transmission systems require low pass filters at the customer end to prevent high frequency ADSL signals from interfering with the POTS service and also to prevent HF transients from the POTS interfering with the ADSL transmission.

In the context of a telephone line carrying both ADSL & POTS signals, it has been found that multiple in-line filters on a single line cause progressive degradation of return loss at the POTS/Line ports.

Australian Application No. 36813/99 discloses the use of a switched capacitor to change the filter characteristics when the phone goes off-hook and to reduce the effect of multiple filters on the one line. This may, for example change the filter from a second order filter to a fourth order filter.

DISCLOSURE OF THE INVENTION

According to the present invention we propose to use a switched impedance inserted on the low frequency side of the filter to change the filter characteristics when the customer equipment (such as a phone) goes off-hook.

In a further embodiment we propose the use of a complex impedance rather than a capacitor as the switched impedance. In this embodiment both the filter rolloff characteristics and telephone sidetone performance are improved.

BRIEF DESCRIPTION OF THE DRAWINGS

FIG. 1 shows a filter arrangement incorporating a switchable capacitor, 8, within the filter.

Figure 1:
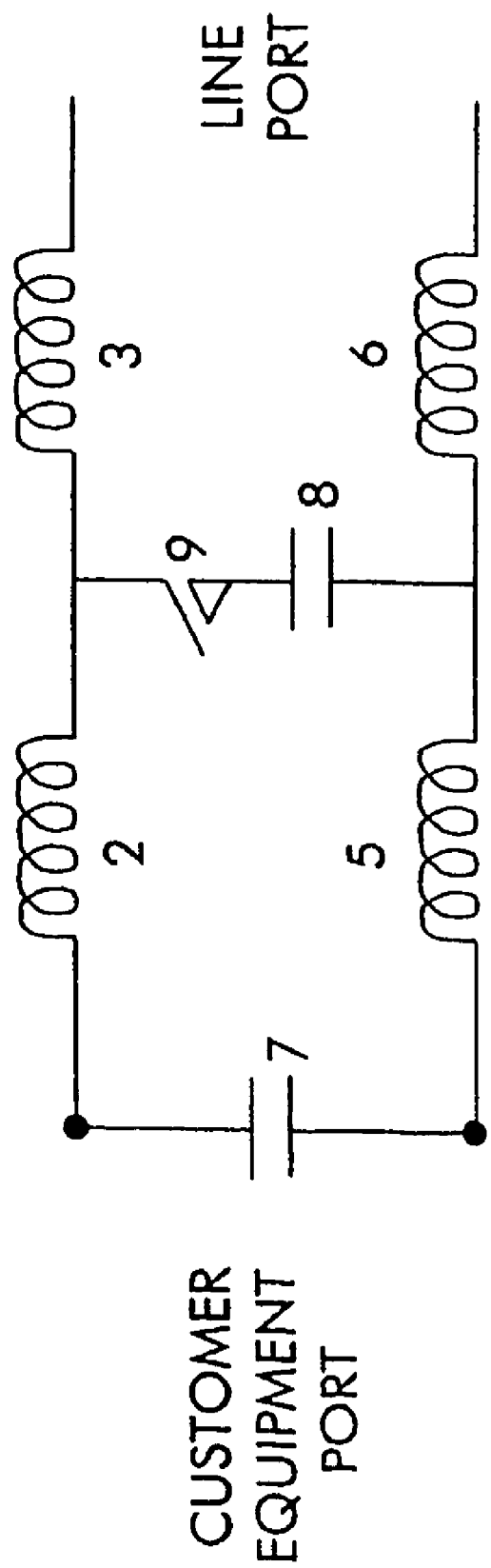
FIG. 1 shows an arrangement in which the filter characteristics are altered by inserting a switched capacitance as an element of the filter.

The filter includes the inductors 2, 3, 5 and 6 and the capacitor 7 as well as the switchable capacitor 8 connected between the junction of inductors 5 and 6 and via switch 9, the junction of inductors 2 and 3.

When switch 9 is open and capacitor 8 is disconnected from the filter, the filter has a second order lowpass characteristic. Closing the switch 9 incorporates the capacitor 8 into the filter and substantially alters the filter performance. The filter then has a fourth order characteristic with faster roll-off rate and the roll-off point is moved to a substantially higher frequency, so that the filter passes more of the higher frequency band.

In a known embodiment, described in our application Ser. No. 36813/99, the switch 9 is a metallic switch operated by an electromagnetic relay coil (not shown) incorporated in the telephone loop. Thus, when the phone goes OFF-HOOK, the relay is energized and closes the switch 9.

According to an embodiment of our present invention, we do not modify the order of the filter by using a switchable capacitor as an element of the filter.

Preferably, we provide a return loss correction function activated when the customer equipment goes off-hook by incorporating a switchable impedance on the low frequency side of the filter. Because we do not alter the filter characteristics, we reduce the consequences of the change in filter characteristics.

Figure 2:
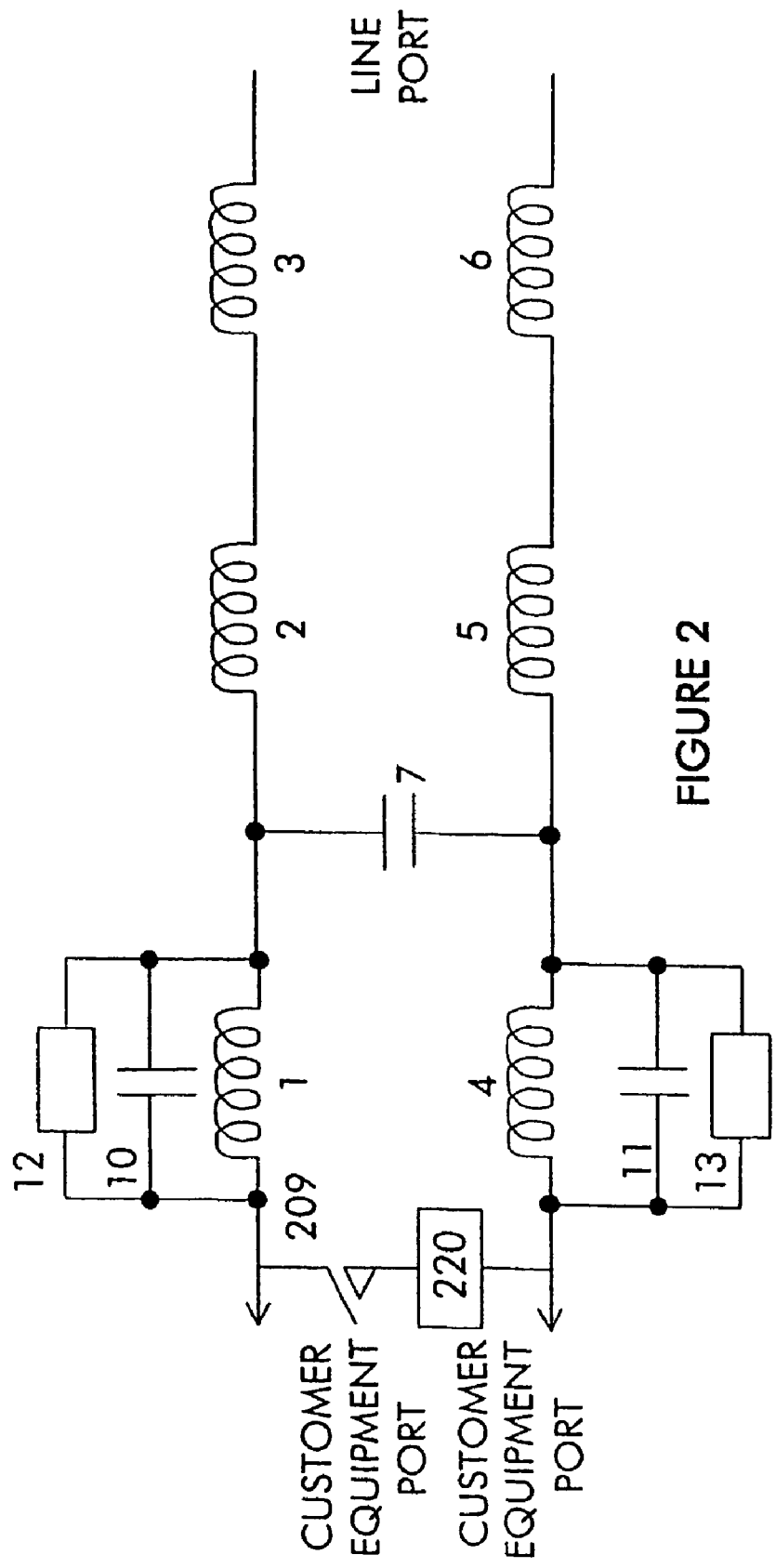
FIG. 2 shows a circuit embodying the invention.

As shown in the embodiment of FIG. 2, we incorporate a switchable return loss correction circuit including impedance 220 between the customer equipment port and a fixed return loss correction circuit 1, 4, 10, 11, 12, 13, the fixed return loss circuit providing correction over a first range, for example, 2 to 4 kHz. The switchable return loss correction circuit 220 by closing switch 209 provides correction over a wider range, e.g. 3 to 20 kHz. The fixed return loss circuit is balanced between the two wires of the line.

We have found that when the filter is to match a complex impedance the return loss characteristics can be improved by using a complex impedance to more nearly approximate the reference impedance than is possible with the use of a capacitor alone.

Figure 3:
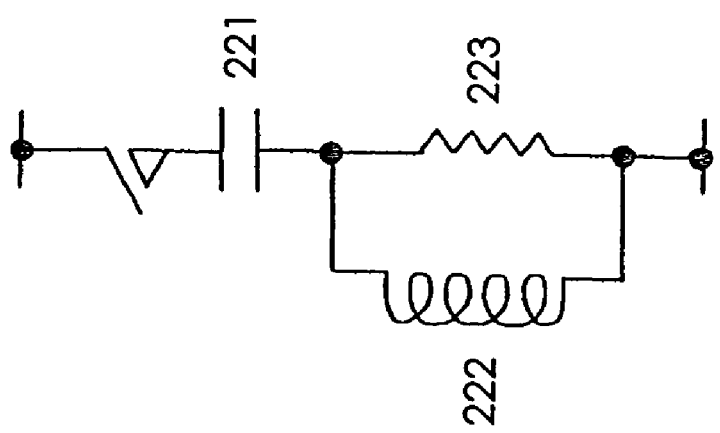
FIG. 3 shows an embodiment of a return loss correction circuit for use in the circuit of FIG. 2.

As shown in FIG. 3, the switchable return loss correction circuit includes a capacitor 221, an inductor 222, and a resistor 223. These components are chosen to optimize return loss when the line is looped.

The fixed return loss correction circuit is automatically connected across the line by line sensing means such as a relay which is activated by the line current when the line is looped.

In a further inventive embodiment we use a novel solid state switch instead of an electro-mechanical relay.

According to the first embodiment of the switch there is provided a polarity insensitive solid state switch controlling a shunt load, the switch including:

first and second transistors connected in anti-parallel in series with the shunt load; and a longitudinal current sensor controlling the control electrodes of both transistors.

Preferably, the current sensor is a current sensing resistor in series with a second load. Each transistor may be a bipolar transistor and the current sensing resistor is preferably connected between the base and emitter of each transistor.

Figure 4:
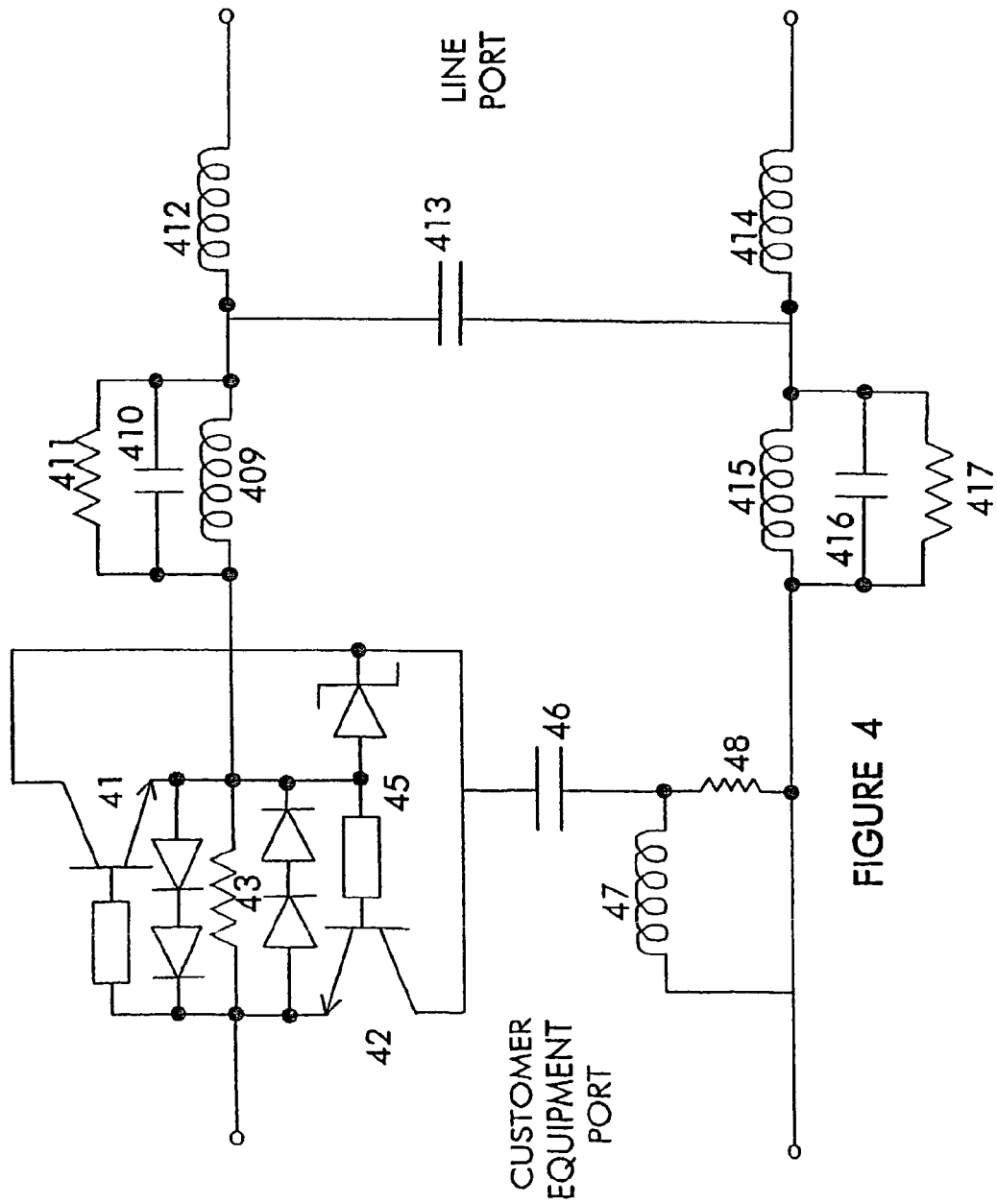
FIG. 4 shows an embodiment of the invention employing an innovative switching arrangement.

A circuit embodying this which is shown in FIG. 4. A pair of transistors 41, 42 are connected in anti-parallel in series with a return loss correction circuit including capacitor 46, inductor 47 and resistor 48. A load sensing resistor 43 is connected between the base and emitter of each of the transistors 41, 42. The transistors 41 and 42 are arranged so that they are both "OFF" when the line is not looped (no line current), and so that one or other of the transistors is "ON" when the line is looped (line current present), the voltage drop across resistor 43 switching one of the transistor "ON" depending on the line polarity as shown resistor 43 is connected from the emitter to the base of transistor 41, and from the base to emitter of transistor 42 assuming, e.g., that the upper line is positive with reference to the lower line. Thus the base-emitter voltage applied to transistor 41 by resistor 43 is in the opposite sense to that applied to transistor 42.

As shown in FIG. 4 the switchable return loss correction circuit 46, 47, 48 is connected on the low frequency side of filter 412, 413, 414. In this embodiment, another return loss correction circuit, 409, 410, 411, 415, 416, 417 is connected between the switchable return loss correction circuit and the filter.

The invention claimed is:

1. A communication filter arrangement comprising a filter and a switchable return loss correction circuit coupled to one side of the filter, wherein the switchable return loss correction circuit comprises:

a resistor and an inductor connected in parallel;

a polarity insensitive solid state switch controlling a shunt load; and, a capacitor connected in series between the switch and the parallel-connected resistor and inductor.

2. The communication filter arrangement as claimed in claim 1, wherein the filter is a low pass filter, and the switchable return loss correction circuit is inserted on the low frequency side of the filter.

3. The communication filter arrangement as claimed in claim 1, wherein a fixed return loss correction circuit is inserted between the filter and the switchable return loss correction circuit.

4. The communication filter arrangement as claimed in claim 1, further comprising a line sensor which monitors a line status, wherein the line sensor switches on the switchable return loss correction circuit when the line is in a first condition, and switches off the switchable return loss correction circuit when the line is in a second condition.

5. The communication filter as claimed in claim 4, wherein the first condition is when the line is looped, and the second condition is when the line is unlooped.

6. An ADSL/POTS filter including a high frequency shunt circuit in parallel with a telephone subset, the filter comprising a switch in series with the high frequency shunt circuit, wherein the switch comprises:

first and second transistors connected in anti-parallel with each other and in series with the shunt load; and a single current sensor connected in series with the shunt load and controlling control electrodes of the first and second transistors, wherein the current sensor switches on one of the transistors when a phone line is looped.

7. The communication filter arrangement as claimed in claim 1, wherein the polarity insensitive solid state switch controls a shunt load and comprises:

first and second transistors connected in anti-parallel with each other and in series with the shunt load; and a single current sensor connected in series with the shunt load and controlling control electrodes of the first and second transistors.

* * * * *